United States Patent [19]

Pammer

[11] 4,440,883
[45] Apr. 3, 1984

[54] ELECTRICALLY INSULATING ENCAPSULATION COMPOSITION FOR SEMICONDUCTOR ARRANGEMENTS

[75] Inventor: Erich Pammer, Taufkirchen, Fed. Rep. of Germany

[73] Assignee: Siemens AG, Berlin and Munich, Fed. Rep. of Germany

[21] Appl. No.: 371,122

[22] Filed: Apr. 23, 1982

[30] Foreign Application Priority Data

May 7, 1981 [DE] Fed. Rep. of Germany ....... 3118130

[51] Int. Cl.$^3$ ............................................. C08K 3/22
[52] U.S. Cl. .................................. 523/402; 523/457; 523/466; 524/430; 524/437; 524/443
[58] Field of Search ...................... 523/402, 457, 466; 524/430, 437, 443; 23/336, 337, 341, 342

[56] References Cited

U.S. PATENT DOCUMENTS

| | | | |
|---|---|---|---|
| 2,941,905 | 6/1960 | Hofmann | 524/430 |
| 2,997,528 | 8/1961 | Kessel et al. | 524/430 |
| 3,206,330 | 9/1965 | Chottiner | 523/457 |
| 3,449,641 | 6/1969 | Lee | 523/457 |
| 4,001,128 | 1/1977 | Penneck | 524/430 |
| 4,206,066 | 6/1980 | Rinehart | 523/457 |

FOREIGN PATENT DOCUMENTS

| | | |
|---|---|---|
| 1789053 | 4/1972 | Fed. Rep. of Germany . |
| 2148690 | 4/1973 | Fed. Rep. of Germany . |
| 2164100 | 6/1973 | Fed. Rep. of Germany . |
| 53-134058 | 11/1978 | Japan ................................ 523/457 |
| 1421149 | 1/1976 | United Kingdom . |

OTHER PUBLICATIONS

Elektronikpraxis, Nr. 3/4, Mar. 1968, pp. 21–24.
Electronics, Sep. 11, 1980, pp. 41 and 42.
Circuits Manufacturing, Aug. 1977, pp. 29–31.

*Primary Examiner*—Lewis T. Jacobs
*Attorney, Agent, or Firm*—Herbert L. Lerner; Laurence A. Greenberg

[57] ABSTRACT

Electrically insulating encapsulating composition for semiconductor arrangements, consisting of a mixture of a resin and an inorganic filler, characterized by the feature that the filler is a silicon compound prepared from at least one highly volatile silicon halogenide compound, selected from the group of silicon oxides, silicon oxide hydrates and silicon nitrides. The filler may be aluminum oxide or aluminum hydroxide prepared from a volatile aluminum halogenide compound.

14 Claims, No Drawings

ELECTRICALLY INSULATING ENCAPSULATION COMPOSITION FOR SEMICONDUCTOR ARRANGEMENTS

BACKGROUND OF THE INVENTION

1. Field of the Invention

The invention relates to an electrically insulating encapsulating composition consisting of a mixture of a resin and an inorganic filler for semiconductor arrangements.

2. Description of the Prior Art

Such encapsulating compositions for enclosing semiconductor arrangements such as discrete semiconductors or integrated circuits, are known, for instance, from German Pat. No. 17 89 053, from German Published Non-Prosecuted Application No. 21 48 690 and German Published Non-Prosecuted Application No. 21 64 100. Examples of resins which can be used are for instance, silicone resins as described in the journal "Elec-tronik-praxis", No. 3/4, Mar. 26, 1968, pages 21-24, and epoxy resins, as is known from, for instance, Circuits Manufacturing, August 1977, pages 29-31. Quartz sand or quartz metal are, for instance, used as inorganic fillers.

If large-scale integrated circuits, for instance, semiconductor memories such as 16k or in particular 64k RAM's (Random Access Memories) are enclosed by such encapsulating compositions or provided with ceramic housings, the natural content of contaminating traces of radioactive thorium and uranium in the ceramic housings or in the inorganic filler causes so-called "soft-error" failures through alpha radiation.

As is known from Electronics, Sept. 11, 1980, pages 41 and 42, these failures can be avoided by covering the semiconductor chip with a thin silicone or polyimide layer, since these layers sufficiently reduce the energy of the alpha radiation coming from the filler or the ceramic housing. Such a covering of the semiconductor chip, however, is not without problems since it can have a negative effect on the tightness of the component housings and the electrical stability of the components. In particular, the different coefficients of expansion of the semiconductor base material (silicon, germanium or a II-V compound) and of the covering film easily lead to torn off contacts of the terminals (nail heads, etc.) which connect the semiconductor chip and the terminal contact pins.

SUMMARY OF THE INVENTION

An object of the invention is to provide an electrically insulating encapsulation composition for semiconductor arrangements which prevents the occurrence of "soft error" failures in large scale integrated components and does not diminish the contact strength of the terminals.

With the foregoing and other objects in view, there is provided in accordance with the invention an electrically insulating encapsulating composition for semiconductor arrangements containing a mixture of a resin and an inorganic filler which is a radiation-free silicon compound selected from the group consisting of a silicon oxide, a silicon oxide hydrate and a silicon nitride, said silicon compound prepared from a radiation-free, highly volatile silicon halogenide compound.

In accordance with the invention, there is provided an electrically insulating encapsulating composition for semiconductor arrangements containing a mixture of a resin and an inorganic filler which is a radiation-free aluminum compound selected from the group consisting of an aluminum oxide and an aluminum hydroxide, said aluminum compound prepared from a radiation-free volatile aluminum halogenide compound.

Other features which are considered as characteristic for the invention are set forth in the appended claims.

Although the invention is illustrated and described herein as embodied in an electrically insulating encapsulation composition for semiconductor arrangements, it is nevertheless not intended to be limited to the details shown, since various modifications may be made therein without departing from the spirit of the invention and within the scope and range of equivalents of the claims.

The invention, however, together with additional objects and advantages thereof will be best understood from the following description.

DETAILED DESCRIPTION OF THE INVENTION

In accordance with the invention, an encapsulating composition of the type mentioned at the outset in which the filler is a silicon compound chosen from the group of silicon oxides, silicon oxide hydrates and silicon nitrides, prepared from at least one highly volatile silicon halogenide compound, or that the filler is an aluminum compound selected from the group of aluminum oxides or aluminum oxide hydrates, prepared from a volatile aluminum halogenide compound. In this manner it is possible to provide an encapsulation composition which is free of alpha radiation because the silicon halogenides or aluminum halogenides used for preparing the filler are considerably more volatile than the corresponding halogenides of uranium and thorium and can, thereby, be freed completely of these through known purification operations, e.g. distillation. The otherwise occurring radioactive contamination traces in the filler can thereby be prevented completely.

It is within the scope of the invention that the silicon compound forming the filler is prepared by hydrolysis or oxidation of highly volatile halogen silanes, or through reaction of halogen silanes with ammonia ($NH_3$) and that chlorosilane such as $SiCl_4$, $SiH_2Cl_2$ and $SiHCl_3$ and fluoro-silanes, particularly silicon fluoride ($SiF_4$) are used. If an aluminum compound is used as the filler, it can be prepared by hydrolysis or oxidation of the volatile aluminum halogen compounds, aluminum chloride ($AlCl_3$) being used preferably as the aluminum halogenide compound.

The silicon halogenide compounds required for the preparation of the fillers which are needed for the encapsulating compositions according to the invention can be prepared in known manner through the action of chlorine or hydrochloric-acid gas on silicon, silicon carbide or on a mixture of $SiO_2$ and carbon to produce chlorosilanes such as silicon tetrachloride ($SiCl_4$), trichlorosilane ($SiHCl_3$) or $SiH_2Cl_2$. The chlorosilanes produced in this process are highly volatile with a boiling point generally below 60° C., and are considerably more volatile than the corresponding chlorides of uranium and thorium. Thus, the boiling point of $SiCl_4$ is 57.6° C., the boiling point of $SiHCl_3$ is 33° C. and boiling point of $SiH_2Cl_2$ is 8.2° C., while $ThCl_4$ sublimates only at 820° C. and $UCl_4$ has a boiling point of 792° C. The chlorosilanes distilled-off in the manufacturing process are therefore free of uranium and thorium impurities to a very large degree and can optionally be purified completely by repeated distillation. Through subsequent hydrolysis or oxidation of the thus purified silicon chloride compounds, for example according to the known reactions, illustrated in the following equations, $$SiCl_4 + H_2O \rightarrow SiO_2 \text{ [or } SiO(OH)_2] + 4HCl$$

$$SiCl_4 + O_2 \rightarrow SiO_2 + Cl_2 \text{ or}$$

$$SiCl_4 + H_2 + O_2 \rightarrow SiO_2 + 4HCl \text{ (SiCl}_4\text{—hydrolysis in a hydrogen/oxygen flame),}$$

silicon oxides or silicon oxide hydrates free of alpha radiation are produced. The silicon oxides or silicon oxide hydrates may be further freed of $H_2O$ and chloride residues by subsequently heating them to 600° to 1200° C., preferably about 1000° C., and densified to $SiO_2$ (sintered) which is suitable as filler.

If $SiHCl_3$ and $SiH_2Cl_2$ are used, immediate combustion of the gas flowing from a nozzle in oxygen can take place, for instance, in accordance with the equation $$SiH_2Cl_2 + O_2 \rightarrow SiO_2 + 2HCl.$$

If silicon fluoride ($SiF_4$) is used as the highly volatile halogen compound, the latter can be obtained, as is well known, through the action of fluorine or hydrogenfluoride gas or of hydrofluoric acid on silicon, silicon carbide, a mixture of $SiO_2$ and carbon, or as illustrated by the following equation $$SiO_2 + 4HF \rightarrow SiF_4 \uparrow + 2H_2O$$

by the action of hydrofluoric acid or hydrofluoric acid gas on naturally found $SiO_2$ such as, for instance, quartz, sand or diatomic earth, which natural materials commonly contain small amounts of radioactive material such as uranium and thorium. The gaseous silicon fluoride produced is condensed, and can easily be purified to remove the radioactive impurities, for instance, by fractional distillation, because the silicon fluoride has a different volatility than the corresponding fluorides of uranium and thorium. Thus, the boiling point of $SiF_4$ is 86° C. and the boiling point of $UF_6$ is +56° C.; $ThF_4$ is still barely volatile at 900° C. Regarding the preparation of $SiO_2$ or silicon oxide hydrate fillers by hydrolysis or oxidation, what was said with regard to the preparation from a silicon chloride compound also applies to a silicon fluoride compound.

If the halogen silanes are reacted with ammonia ($NH_3$) either immediately at elevated temperature (600° to 1100° C.) or sintered (900° to 1000° C.) subsequently to a reaction at 20° to 600° C., silicon nitrides are produced, preferably $Si_3N_4$, which are likewise well suited as radiation-free sintered materials.

If an aluminum oxide or aluminum hydroxide is used as the filler, aluminum chloride ($AlCl_3$), for instance, can be produced by heating aluminum in a hydrochloric acid stream or through the action of phosgene ($COCl_2$) on clay (a naturally occurring material containing aluminum) in a fluidic reactor. Since aluminum chloride sublimates at 183° C., it can be separated in a simple manner from the corresponding chlorides of the uranium and thorium contained as an impurity in the raw material. Aluminum oxides or aluminum hydroxides can be prepared in known manner, for instance by hydrolysis from the aluminum chloride as fillers free of alpha radiation.

For preparing the encapsulating composition according to the invention, a thin resin can be admixed to the alpha-radiation-free filler, as described in German Published Non-Prosecuted Application No. 21 64 100, which resin is available in the prepolymerized condition, for instance, for the preparation of molding compounds. The composition so generated is heated up for degasification, is subsequently cooled for conversion into a vitrious hard state, and is thereupon milled for batch-wise further processing to form powder or granulate. The encapsulation of semiconductor bodies by means of molds is then carried out, for instance, in such manner that the granular encapsulating compound placed in a vessel is heated up therein up to plastification and is pressed, dosed under pressure, into the mold and hardens at a suitable mold temperature. Further conventional additives can be added to the filler or to the resin for improving the properties of the encapsulating composition. The resins and additives can also be processed further in known manner to form casting compounds for embedding components through casting them in, while adding substances which act as hardening compounds and trigger or accelerate the polymerization. The share of the binders which are employed, among other things, for economic and thermal reasons, in the encapsulating composition according to the invention, is advantageously 60 to 80%.

As encapsulating compounds according to the invention, known low-pressure molding compounds with an epoxy, bisphenol A resin, novolak resin or silicone base can be used as the encapsulating compound. Similar epoxy molding compounds are produced, for instance, by admixing the fillers to a bisphenol A hardener mixture which consists of four parts bisphenol A and one part hardener. Silicone molding compounds can be prepared by admixing the filler to only partially cross-linked silicones.

The preparation of a low-pressure molding compound for encapsulating electronic components according to the transfer molding method, which consists of a post-purified epoxy resin based on bisphenol A is furthermore described in German Pat. No. 17 89 053 and German Published Non-Prosecuted Application No. 21 48 690.

I claim:

1. Method for the manufacture of an electrically insulating encapsulating composition for semiconductor arrangements free of contaminating traces of radioactivity which causes soft-error failure through alpha radiation which comprises forming the encapsulating material by admixing a resin and an inorganic filler in the form of a radiation-free compound selected from the group of silicon compounds consisting of a silicon oxide, a silicon oxide hydrate, a silicon nitride, and from the group of aluminum compounds consisting of an aluminum oxide and an aluminum hydroxide, said silicon oxide, silicon oxide hydrate and silicon nitride prepared from a radiation-free, highly volatile silicon halogenide compound and said aluminum oxide and aluminum hydroxide prepared from a radiation-free, highly volatile aluminum halogenide compound.

2. Method according to claim 1, wherein said highly volatile silicon halogenide compound is a highly volatile halogen silane, and wherein said silicon compound is prepared by hydrolysis of said highly volatile halogen silane.

3. Method according to claim 1, wherein said highly volatile silicon halogenide compound is a highly volatile halogen silane, and wherein said silicon compound is prepared by oxidation of said highly volatile halogen silane.

4. Method according to claim 1, wherein said highly volatile silicon halogenide compound is a highly volatile halogen silane, and wherein said silicon compound is prepared by reaction of said highly volatile halogen silane with ammonia.

5. Method according to claim 1 or claim 2 or claim 3 or claim 4, wherein said silicon halogenide compound is a silicon chloride.

6. Method according to claim 1 or claim 2 or claim 3 or claim 4, wherein said silicon halogenide compound is a silicon fluoride.

7. Method according to claim 1 or claim 2 or claim 3 or claim 4, wherein said silicon compound prepared from said silicon halogenide compound is densified by heating it to 600° to 1200° C.

8. Method according to claim 1 or claim 2 or claim 3 or claim 4, wherein said silicon compound prepared from said silicon halogenide compound is densified by heating it to about 1000° C.

9. Method according to claim 1, wherein said radiation-free highly volatile silicon halogenide compound is prepared by action of a chlorinating agent selected from the group consisting of chlorine and hydrochloric acid on a silicon containing material also containing small amounts of radioactive uranium and possibly thorium, selected from the group consisting of silicon, silicon carbide, and a mixture of $SiO_2$ and carbon, to produce volatile chlorosilanes and less volatile chlorides of uranium and thorium, and separating two volatile chlorosilanes from the less volatile radioactive chlorides of uranium and thorium by fractionation to produce radiation-free chlorosilanes.

10. Method according to claim 1, wherein said radiation-free highly volatile silicon halogenide compound is prepared by action of a fluorinating agent selected from the group consisting of fluorine and hydrofluoric acid on a silicon containing material also containing small amounts of radioactive uranium and possibly thorium, selected from the group consisting of silicon, silicon carbide, a mixture of $SiO_2$ and carbon, quartz, sand and diatomic earth, to produce silicon fluoride and fluorides of uranium and thorium, and separating the silicon fluoride from the radioactive fluorides of uranium and thorium by fractionation to produce radiation-free silicon fluoride.

11. Method according to claim 1, wherein the aluminum compound is prepared by hydrolysis of the volatile aluminum halogenide compound.

12. Method according to claim 1, wherein the aluminum compound is prepared by oxidation of the volatile aluminum halogenide compound.

13. Method according to claim 1 or claim 11 or claim 12, wherein the aluminum halogenide compound is aluminum chloride.

14. A semiconductor arrangement encapsulated in an electrically insulating composition containing a mixture of a resin and an inorganic filler which is a radiation-free silicon compound selected from the group consisting of a silicon oxide, a silicon oxide hydrate and a silicon nitride, said silicon compound prepared from a radiation-free, highly volatile silicon halogenide compound.

* * * * *